United States Patent [19]

Grünenfelder

[11] Patent Number: 5,399,253
[45] Date of Patent: Mar. 21, 1995

[54] PLASMA GENERATING DEVICE

[75] Inventor: Pius Grünenfelder, Wangs, Switzerland

[73] Assignee: Balzers Aktiengesellschaft, Liechtenstein

[21] Appl. No.: 153,608

[22] Filed: Nov. 16, 1993

[30] Foreign Application Priority Data

Dec. 23, 1992 [CH] Switzerland .................. 3911/92

[51] Int. Cl.$^6$ ............................................. C23C 14/35
[52] U.S. Cl. ........................... 204/298.2; 204/298.37; 156/345; 118/723 R; 118/723 MR; 118/723 MA; 118/723 E
[58] Field of Search .................. 204/298.2, 298.37; 156/345; 118/723 R, 723 MR, 723 MA, 723 E

[56] References Cited

U.S. PATENT DOCUMENTS

| 3,956,093 | 5/1976 | McLeod | 204/192.12 |
| 4,466,877 | 8/1984 | McKelvey | 204/298.23 |
| 4,600,492 | 7/1986 | Ooshio et al. | 204/298.2 |

FOREIGN PATENT DOCUMENTS

| 0065277 | 5/1982 | European Pat. Off. | 156/643 |
| 0070899 | 7/1987 | European Pat. Off. | 204/298.09 |
| 0503138 | 10/1991 | European Pat. Off. | 204/298.2 |
| 2417288 | 8/1975 | Germany | 204/298.19 |
| 2707144 | 8/1977 | Germany | 204/298.2 |
| 61-295368 | 12/1986 | Japan | 204/298.2 |
| 61-295369 | 12/1986 | Japan | 204/298.2 |
| 2-30757 | 2/1990 | Japan | 204/298.2 |
| 4-276069 | 10/1992 | Japan | 204/298.2 |

*Primary Examiner*—Aaron Weisstuch
*Attorney, Agent, or Firm*—Notaro & Michalos

[57] ABSTRACT

A plasma generating device to treat substrates in a vacuum chamber, includes a cathode which, at its upper surface, contains the material to be treated in the form of a target. At least one magnetic device is provided at the back side of the target, to generate, in the area of the cathode surface, at least one tunnel-like magnet field which forms tunnel foot poles on the cathode surface, whereby the tunnel-like field extends at least along a part of a horizontal tunnel axis. The magnetic device includes a mechanism for displacing at least one of the tunnel foot poles perpendicular to the horizontal tunnel axis. The magnetic device also includes a fixed first magnetic pole generating device and surrounding, as a closed frame, at least a second magnetic pole generating device which contains the mechanism for displacing the corresponding tunnel foot pole. The second magnetic pole generating device consists of a pair of permanent magnets which are placed on their longitudinal axes parallely pivotable to the target such that, in the area of the cathode surface, a tunnel-like laterally modifiable magnet field is generated.

10 Claims, 3 Drawing Sheets

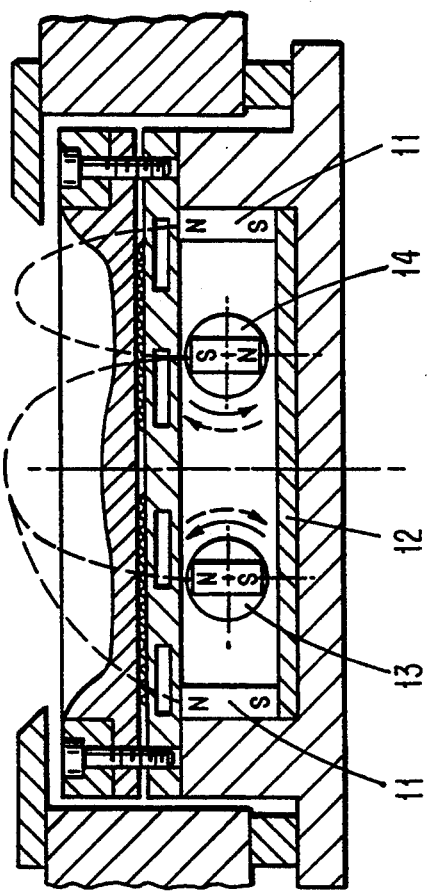
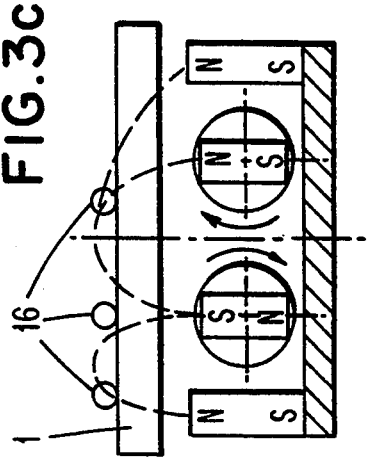
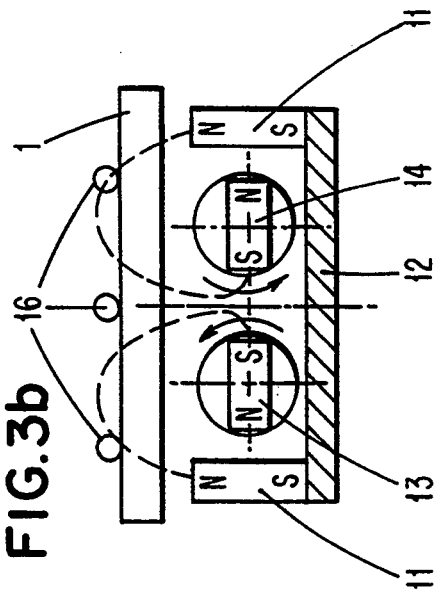
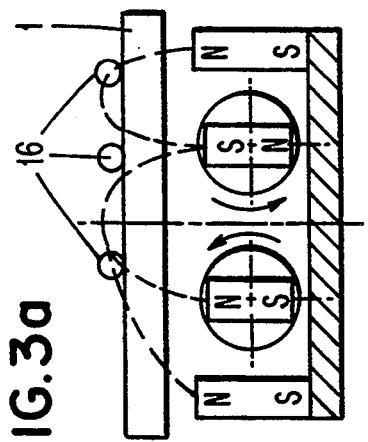
FIG.3
FIG.3a FIG.3b FIG.3c

PLASMA GENERATING DEVICE

FIELD AND THE INVENTION

The invention relates to a plasma generating device to treat substrates in a vacuum chamber by means of a cathode which, at its upper surface, contains the material to be treated in the form of a target with at least one magnet device on the target's back side to generate at least one tunnel-like magnetic field in the area of the cathode surface, which generates poles at the "tunnel foot points" of the cathode's surface, whereby the tunnel-like field extends at least along a part of a horizontal tunnel axis.

BACKGROUND OF THE INVENTION

Magnetic field supported plasma generating devices are widely known and used. They are used especially as sputtering devices to coat substrates with thin films (PVD). Such plasma discharges are also used to remove material from substrates, which is also called sputter-etching. Further, such plasma discharges are also Used with so-called PECVD methods where, by means of plasma activation from the gas phase, a chemical deposition of thin films takes place on the substrates. Mixed PVD and CVD methods are also common. Most suitable and widely spread are plasma generating devices that function according to the so-called magnetron principle. Magnetron sputtering, for instance, has become a commonly used method due to the high sputtering rates that can be reached and the simple operation of the arrangement as well as the easy controllability. The magnetron sputtering source can be used in any position and its many ways of operation as a wide area source are advantageous for fully automated production equipment. Such a source consists of a cathode which is applied with a negative voltage in a vacuum chamber, where at the same time a plasma discharge is maintained by an inert gas such as argon or a mixture of inert gases with reactive gases, and the so produced ion bombardment sputters the target and makes it possible to deposit a thin film on a substrate positioned in the chamber. In order to reach a high plasma density and thus a high sputtering rate the plasma discharges are concentrated by means of magnetic fields. This, for example, is performed with magnetron sources by arranging magnetic field generating devices on, beside, or on the back side of the cathode or the target in such a way that the magnetic field enters and exits through the target so that a tunnel-like structure is formed which on the target front side acts as an electron trap for the plasma discharge. The effect is further enhanced when the tunnel-like electron trap is formed like a ring and thus forms a closed loop on the front side of the target. The electron trap thus becomes very efficient. Such an apparatus is described in the German Patent Specification DE 24 17 288.

The above described magnetron source has the disadvantages that the elongated form of the plasma loop leads to a trench-like erosion of the target material. This trench-like erosion leads to a very bad utilization of the target material in a range of 20 to 30%. According to the German Offenlegungsschrift DE-OS 27 07 144, which is important prior art related to the present invention, it is suggested to move the magnetic electron trap and the target relative to each other in order to neutralize this disadvantage. It is disclosed that not only the target can be moved above the magnet system as a rotating plate or as a rotating cylinder, for example, but also the magnetic system itself can be moved under the target. In both cases the target is eroded more homogeneously. The same result can be reached with a wandering electro-magnetic field. In both cases, it is suggested that the entire electron trap or the closed loop discharge be moved relative to the target. The practical realization of the electro-magnetic version is linked to high efforts and costs, for high magnetic flow densities of some hundred Gauss must be produced within a small space. The mechanical moving of the whole magnetic system as well as of the target is also very space consuming when practically realized and leads to large apparatus sizes. One example for a cylindrical target moving around a fixed magnetic system is shown in the U.S. Pat. No. 4,356,073. For the arrangement where the magnetic system is positioned inside the cylinder the presented solution requires high constructional efforts.

SUMMARY AND OBJECTS OF THE INVENTION

The present invention is intended to neutralize the disadvantages of the prior art. The main focus is to provide a plasma generating device which permits a plasma discharge in preset areas over a cathode surface of a sputtering or etching device, for example, which yields a defined or a uniform target erosion with a compact and economical structure.

The present invention resolves this task according to the following. With magnetron discharges where at least a part of the plasma loop is elongated it is recommended to not move the entire electron trap. It is sufficient if only a part, especially a rectilinear part of the electron trap is moved. Further, it is recommended that only one side of the "tunnel foot pole" of the rectilinear part be moved. The "tunnel foot pole" is the magnetic pole which is generated at the cathode surface by means of the tunnel-like magnetic field. A magnetic field tunnel always forms an entry and an exit pole on the cathode surface. The arrangement is especially simple and efficient when a simple ring discharge is used where only the middle tunnel foot pole is moved. By a controlled movement of the rectilinear part of this middle tunnel foot pole, for example by moving it forward and backwards periodically, the middle position as well as the width of the plasma discharge above the target are changed. With a sputter-discharge this leads, for example, to a more homogeneous erosion of the target surface. A further advantage of the device according to the invention prevents zones on the target from being overscanned by the plasma. This is especially important with reactive applications, especially when sputtering dielectric materials for optical thin film applications such as multi layer optical films. It is, of course, also possible to construct the arrangement with more than one ring discharge, i.e. with several large-surface plasma discharge rings where several rectilinear tunnel foot points can be moved.

As said before, magnetic field supported plasma generating devices can also be constructed without closed magnetic field loops or plasma loops. In this case, however, the effect of the electron trap is reduced and the plasma discharge must be operated with higher voltages. Further, the maximum possible discharge power or the plasma density is lowered by this fact. It is therefore a big advantage to use a magnet field generating device which defines a plasma discharge with a closed plasma loop. In this case the construction according to the invention can be realized very easily. An outer frame consisting of permanent magnets can be used, for instance, for forming a first magnetic pole generating device so that a tunnel-like magnetic field is produced between the first and second magnetic pole generating devices. With an elongated planar construction—as is often required for practical applications—the inner or second magnetic pole according to the invention can be moved laterally to increase the length of the cathode along the planar surface. By periodically moving forward and backwards the corresponding tunnel foot pole, for instance, the plasma discharge will follow and thus with a sputtering or an etching device, for example, lead to a more spacious and more homogeneous erosion of the cathode or the target surface, respectively. The arrangement will become very simple, as according to the invention, only the rectilinear part of the tunnel foot poles has to be moved. The complicated discharge relations of the magnetron ring discharge thus can be controlled better than if the entire ring-like electron trap configuration is modified.

It is, of course, possible to operate several ring discharges with the configuration according to the invention, which means that several rectilinear movable tunnel foot poles are provided within the fixed frame-like magnet frame. The movement can also be operated according to a certain profile, which produces a certain average distribution profile of the plasma density. With a sputtering device, for example, this permits the form of the target erosion to be predefined as desired. Further, this also makes it easier to define or fix the distribution characteristics of the sputtered material parts. The configuration according to the invention can be built easily and economically if permanent magnets are used to generate the magnetic fields and if the part of the magnet device forming the lengthwise tunnel foot pole can be moved mechanically. This is, however, also possible by using electro-magnetic configurations or combinations of such permanent magnets.

When practically operating with linear parallel movable magnet packages there are high mechanical forces acting which cannot be easily controlled and which require a concern for the bearings of the system was well as for the drive means. An advantageous and recommended solution to this problem is obtained by forming the configuration according to the invention such that the lengthwise magnetic pole generating packages are pivotable on the longitudinal axis. The pivot bearing can manage the different lifting forces, the mechanical effort being correspondingly low. The required drive power is also very low and lies within a range of a few Watts up to approximately 100 Watts of the engine drive performance, always depending of the size of the plasma generating device. With a cathode size of approx. 45 cm a drive energy of approx. 100 Watts is fully sufficient. With larger configurations correspondingly larger drive dimensions are required. A most suitable configuration, for instance, consists of an outer fixed permanent magnet pole frame which embraces two pivotable rectilinear magnetic pole lines. The poles then in the beginning are positioned at the side facing the target on one length side of the outer frame corresponding to the pivotable neighboring pole, the pivotable second pole being positioned as an anti pole. To prevent an interruption of the plasma the pivotable poles must be turned smoothly against each other so that after a turn of 90° the poles are positioned correspondingly on the middle axis of the configuration. After another 90° turn the pivotable poles have changed their sides. The tunnel foot pole which resulted at the target surface now has wandered from one side to the other, the outer tunnel foot pole being formed depending on the position of the outer pole frame and the one pivotable magnet pole. After a 180° turn the situation changes to the other side. To reach a homogeneous movement and a width modulation of the tunnel foot poles respectively without interrupting the plasma discharge, the magnets are turned back by 180°. With sputtering devices consisting of such a configuration, target utilization rates up to 70% and more can be easily reached.

The mechanical construction can be further simplified if a continually turning engine drive with an interposed pendulum drive is used which guarantees that the pivotable magnetic lines swing to and fro by 180°. Any known engines, such as electro-, hydro-, pneumatic engines and others can be used as drive.

If large size cathodes are wanted there is no problem to build a configuration consisting of several pivotable magnetic pole generating devices. The pivotable magnet pole generating devices can not only be moved forward and backwards continually in order to generate a kind of wobbling of the plasma discharge on the cathode surface area, but they can also be aimed at and moved in a way that the tunnel-like electron trap is highly worsened in its effect, which leads to the destruction of the corresponding plasma loop or to the favoring of the corresponding plasma ring discharge. It is thus possible to controllably switch on and off singular plasma loops above a cathode surface, which means that it is possible to, for instance, scan the cathode surface by the local placing of the ring discharge.

Further, it is possible not only to chronologically preset the position of the plasma discharge by means of the present invention but also to lead the discharge power synchronously to preset value in different positions of the plasma discharge. This, for example, can be realized by means of a controllable power supply where the discharge power can be guided by control means. In the extreme this modulation can also be pulsed or switched. Pulsing, for instance, has the additional advantage that when sputtering dielectric materials by a reactive process, unwanted spark-overs are mostly prevented or the discharge can be controlled to be stable. The combination of a locally variable plasma discharge with a modulable power supply allows control of the erosion characteristic or the distribution characteristic of the sputtered material, respectively.

BRIEF DESCRIPTION OF THE DRAWINGS

Practical embodiments of the invention will now be explained more specifically by means of the figures.

FIGS. 3 and 3a through 3c show schematically and in a cross-sectional view different advantageous positions of the magnet configuration of FIG. 3.

DETAILED DESCRIPTION OF THE INVENTION

The figures schematically show different ways of practical embodiments of plasma generating devices, wherein the illustrated examples-show sputtering devices. The same functioning can, however, also be used in etching devices. In such a case, a substrate instead of a sputtering target is treated by sputtering or by reactive processes.

Figure 1A:
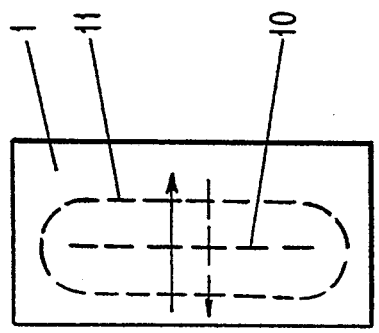
FIGS. 1 and 1a show the schematic cross-section of a cathode configuration of a sputtering source with movable electron trap according to the prior art.
Figure 1:
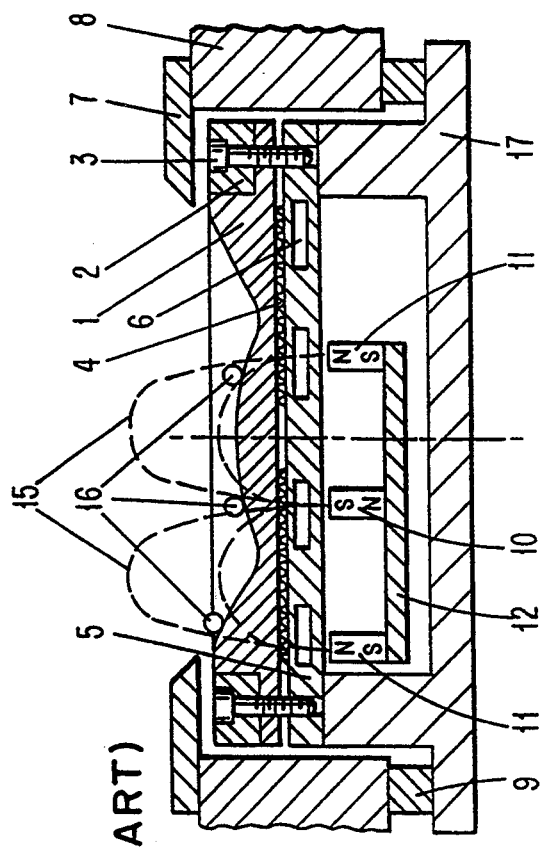

FIG. 1 shows a so-called magnetron sputtering device according to the prior art. The cathode body consisting of a housing 17, a cooling plate 5 with cooling channels 6 and a target 1, is flanged on a vacuum chamber 8 by means of tightenable isolation means 9. The sputtering target 1 is pressed against the cooling plate 5 by means of a holding frame 2 with screws 3 and a contact foil 4. The vacuum chamber, in addition, is fitted with a shield 7 which at the same time forms an anode and is placed so that it peripherally embraces the cathode configuration. The entire configuration, for instance, is constructed as a rectangle where the target, for example, is of the typical size of 145×450 mm. Behind the cooling plate 5 is placed a magnet system consisting of an outer permanent magnet frame 11 which encircles a central magnet 10 which forms an anti pole to the outer frame. The magnets are placed so that they produce a tunnel-like field 15 which goes through the cooling plate 5 and the target 1 and thus forms a ring-like electron trap in front of the target surface. On the back side, the magnet system is provided with a pole plate 12 of ferromagnetic material in order to close the backside magnetic field flow. The magnet pole generating devices 10, 11, 12 or the magnet system are constructed such that tunnel foot poles 16 result on the target surface when the field lines enter and leave through the tunnel-like field 15. The magnet pole generating devices 10, 11, 12 can be structured in many different ways, however, the important thing is that at the target surface there is a tunnel-like magnet field 15 forming a loop with the corresponding tunnel foot poles 16 on the target surface. To produce a plasma discharge a negative voltage of several hundred Volts, for example, is applied to the cathode body 17 or the target 1, respectively, in relation to the anode 7. As is known, the cathode can also be operated with an AC power supply within the range of several 100 Hz to kHz of middle or high frequency. Combinations or overlappings of AC and DC sources are also possible. Further, additional electrodes in the common bias configurations may be used. The vacuum chamber is then set to an Argon gas pressure of approx. $10^{-2}$ through $10^{-3}$ Millibar. From the ring-like plasma discharge produced above the target, ions are accelerated towards the target 1 which erode a ring-like trench. To prevent this disadvantage it is suggested - as shown in FIG. 1—to move the magnet pole generating devices 10, 11, 12 as a whole. This movement of the entire electron trap also results in a movement of the whole plasma ring. The target 1, as shown in FIG. 1, is thus eroded relatively homogeneously. The required drives and bearings to move such a magnet system 10, 11, 12 are quite costly. The resulting construction sizes are hindering and restricting. Further, there appear intersections in the curved area of the plasma pattern which make the target erosion profile unfavorable and concentrate the erosion on certain places of the target end zones. This then reduces the maximal utilization of a target, as the target is completely eroded in these limited areas even before the large-surface, lengthy main target area can be completely eroded, and thus it cannot be used efficiently. As the plasma in certain areas only temporarily lies over the entire target surface there may be disadvantages relating to undesired arc discharges and discharge instabilities with reactive processes, especially when dielectric materials are sputtered. Presetting of a desired erosion profile is also limited. Such configurations can, as is known from the prior art, be used in many different ways with other cathode geometries such as tubular configurations. FIG. 1a in a schematic top view shows how the magnet device 10, 11 drawn in dashed lines can be moved forward and backwards under a target 1 in the direction of the arrow.

Figure 2A:
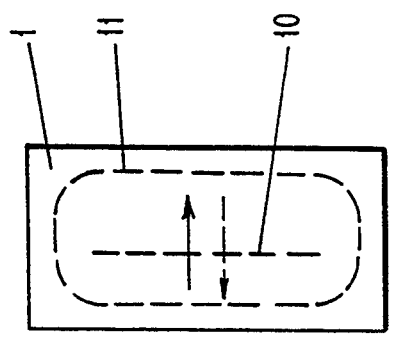
FIGS. 2 and 2a show the cross-section of a first configuration of the invention.
Figure 2:
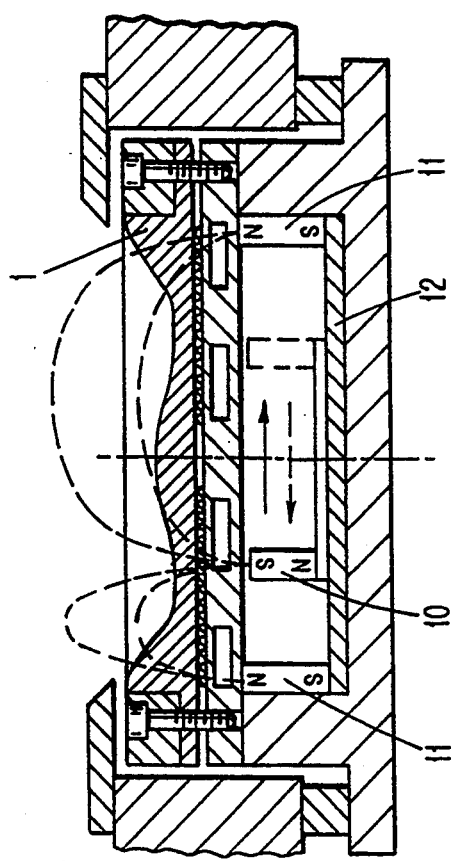

FIG. 2 shows schematically and as an example the cross-sectional view of a first version of the inventive solution. The first magnet pole generating device 11 is formed as a frame which is in a fixed position relative to the target 1. A second magnet pole generating device 10 is placed so that it can be laterally displaced related to the cathode longitudinal axis within the encircling magnetic pole generating device 11. To show this, FIG. 2a shows this in a top view. The deflection amplitude of the forward and backwards movement of the second magnetic pole generating device 10 is chosen so that the desired erosion is produced on the target 1. This can be calculated easily by simple common tests. The deflection amplitude may, however, only reach so far that the tunnel foot poles 16 do not disappear from the target surface 1 or that the tunnel-like electron trap 15 on the cathode surface does not completely disappear and thus inhibit the plasma discharge. If this is wanted one can profit from this effect in certain cases by switching off the plasma discharge. The movement of the second magnet pole generating device 10 can be obtained by the use of known drive means. In practical embodiments it is especially favorable to use a pendulum gear which is placed between the magnet pole generating device 10 and the driving unit. It is, however, also possible to make a controlled movement without such an interposed pendulum gear by using a controlled motor device.

A preferred embodiment of the invention is shown schematically in the cross-sectional view of FIG. 3. Within this first framelike magnet pole generating device 11 are two permanent magnet configurations 13 and 14 which can be turned around their longitudinal axes. The magnets are placed so that they can produce tunnel-like magnetic fields above the target surface as is known. For this purpose, the pair of permanent magnets 13 and 14 must be provided at a sufficient distance from the pole plate for closing the back side magnetic field flow 12. FIG. 3a shows a first, starting position of the pivotable permanent magnet configurations 13, 14. The left pivotable magnet 13 is set so that its pole at the side closest to the target corresponds to the pole of the magnet frame 11. The right pivotable magnet 14 is positioned as an antipole. This on the left side results in a tunnel-like field 15 between the magnets 14 and 13 and 11, and between the magnets 14 and 11 on the right side. If now the magnets 13 and 14 are both turned 90° in the same direction the poles of the magnets face against each other homopolarly. The dipole forming magnets 13 and 14 are now directed parallel to the target plate 1, as is shown in FIG. 3b. The two opposite lying and repulsing poles of the magnets 13 and 14 in this position produce a resulting tunnel foot pole 16 in the center of the target surface. This tunnel foot pole thus has wandered from the right to the left. This also leads to a displacement of the plasma position and the width of the discharge above the target. The poles of the magnets 13 and 14 turned away from the center now corresponds to the ones turned towards the target of the frame-like magnet pole generating device 11. A further turn of the magnets 13, 14 by 90° is shown in FIG. 3c. This further turn of the magnets 13, 14 displaces the tunnel foot poles 16 and thus the plasma discharge further to the left of the target. The turning direction of the magnets 13 and 14 must always be chosen in a way that the poles of the magnets 13, 14 closer to the target never face each other in antipolar relation to the frame magnet pole 11 closer to the target in the outer intermediate area of the magnets 11, 14 or 11, 13 so that a tunnel-like field would be interrupted or destroyed. If a continuous operation of the discharge is desired this issue must be paid attention to. In certain cases, however, an intended overturning and destruction of the electron trap may be desired in order to interrupt the plasma. By means of a controlled drive the magnets 13, 14 can be easily moved so that a certain erosion profile can be reached. Again the interposition of a pendulum gear between drive engine and magnets 13, 14 is most suited to simplify the configuration. One thus can operate without a controlled drive, which further simplifies the configuration. The suggested realization may of course also be used in, for example, tubular cathode configurations.

Figure 4A:
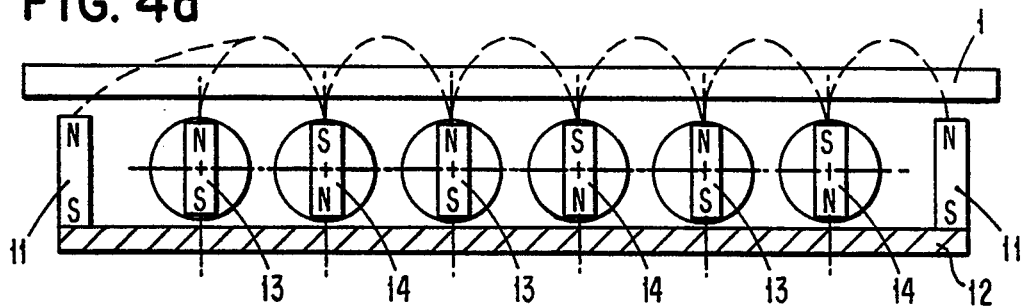
FIGS. 4a through 4c show schematically and in a longitudinal section another example of a configuration of the magnetic pole generating devices for several movable plasma rings.
Figure 4B:
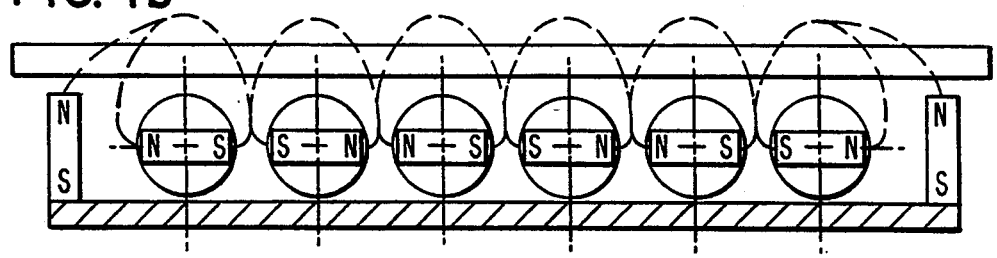
Figure 4C:
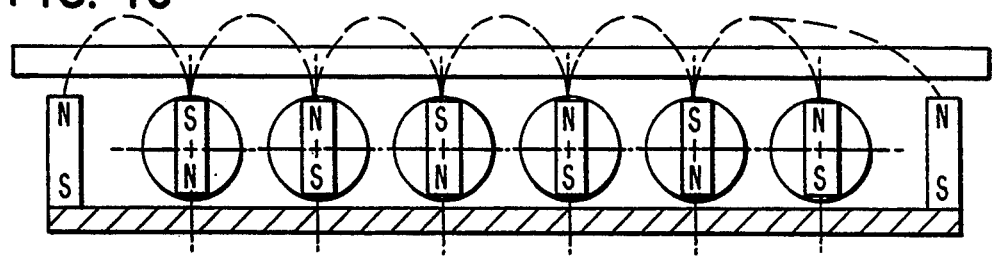
Figure 4D:
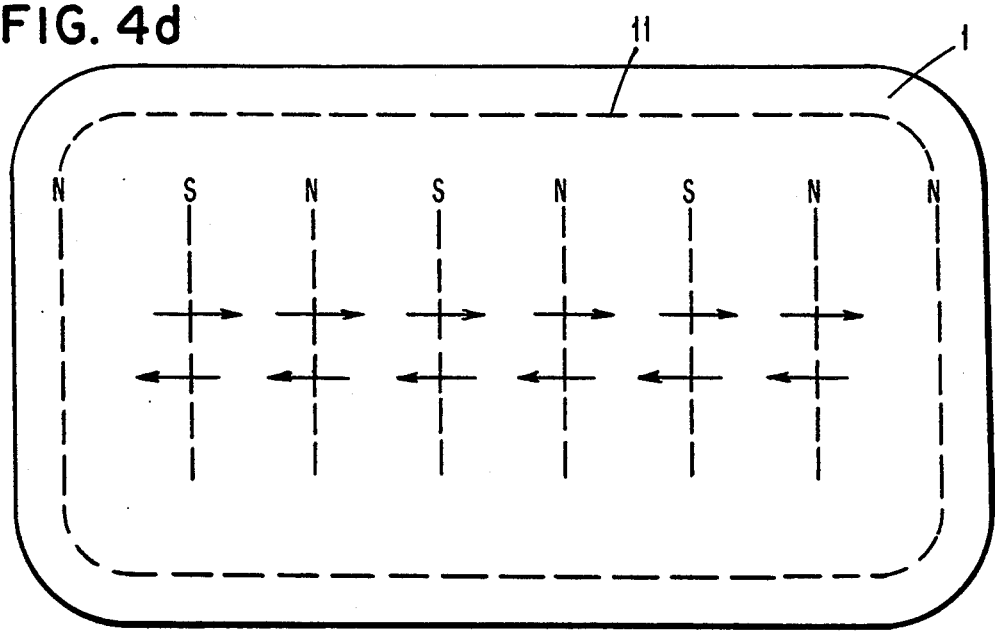
FIG. 4d shows the schematic plan view of the configuration of FIGS. 4a through 4c.

FIGS. 4a through c schematically show the sectional view of a configuration of the invention in the case where the principle according to FIG. 3a is applied to a large-surface configuration. If, for instance, three pivotable magnet pole pairs 13, 14 are used, three plasma loops can be produced which can be controllably moved above the target 1. The plasma loops can, however, also be switched on and off in sequences by deflecting one or more pivotable magnet poles so that the effect of the electron trap is inhibited at the corresponding desired position. FIG. 4d schematically shows a top view of the large-surface configuration with multiple movable tunnel foot poles.

I claim:

1. A plasma generating device to treat substrates in a vacuum chamber, comprising a cathode (17,5,2,1) which at its upper surface contains the material to be treated in the form of a target (1) and comprising at least one magnetic device (10,11,12) at the back side of the target to generate in the area of the cathode surface at least one tunnel-like magnet field (15) which forms tunnel foot poles (16) on the cathode surface, whereby the tunnel-like field (15) extends at least along a part of a horizontal tunnel axis, and the magnetic device (10,11,12) includes means for displacing at least one of the tunnel foot poles (16) perpendicular to the horizontal tunnel axis, the magnetic device (10,11,12) including a fixed first magnetic pole generating device (11) and surrounding, as a closed frame, at least a second magnetic pole generating device (10) which contains said means for displacing the corresponding tunnel foot pole (16), the second magnetic pole generating device consisting of a pair of permanent magnets (13,14) which are placed on their longitudinal axes parallely pivotable to the target (1) such that in the area of the cathode surface a tunnel-like laterally modifiable magnet field is generated.

2. The plasma generating device of claim 1, wherein the poles of the magnets (11,12,13) in first positions thereof, are positioned antipolarly opposite the position closer to the target whereas an edge pole pair (11,13; 11,14) is always placed homopolarly with the closes frame (11).

3. The plasma generating device of claim 2, wherein the magnet pair (12,13) is pivotable with its poles oppositely oriented by 180° so that in a middle position the poles are equal and repulsive.

4. The plasma generating device of claim 3, wherein the magnet pair (12,13) is coupled to a pendulum drive device.

5. The plasma generating device of claim 4, wherein the pendulum drive device consists of a pendulum gear unit and a motor drive.

6. The plasma generating device of claim 1, wherein several pairs of pivotable magnets (12,13) are provided.

7. The plasma generating device of claim 6, including a drive control for the magnet pairs (12,13) for providing a controlled lateral movement of the rectilinear partial areas of the tunnel-like magnet field (16) according to a given moving profile.

8. The plasma generating device of claim 6, wherein a drive control for the magnet pairs (12,13) provides sequential on and off switching of the tunnel-like partial areas of the magnetic field for a sequential on and off switching of the plasma discharge in different areas of the target surface.

9. The plasma generating device of claim 1, wherein the device is one of a sputtering device, an etching device, and a plasma CVD device.

10. The plasma generating device of claim 1, wherein a modulatable or a pulsable power supply is coupled with the plasma generating device and is further coupled to synchronize the means for moving the tunnel foot poles.

* * * * *